(12) United States Patent
Hoffman et al.

(10) Patent No.: US 10,460,922 B2
(45) Date of Patent: Oct. 29, 2019

(54) METHOD AND APPARATUS FOR SUBSTRATE TRANSFER IN A THERMAL TREATMENT CHAMBER

(71) Applicant: Applied Materials, Inc., Santa Clara, CA (US)

(72) Inventors: James Hoffman, San Jose, CA (US); Atsushi Kitani, Nara (JP); Hsin-Hsien Wu, Tainan (TW); Chia-Hung Chen, Tainan (TW)

(73) Assignee: Applied Materials, Inc., Santa Clara, CA (US)

( * ) Notice: Subject to any disclaimer, the term of this patent is extended or adjusted under 35 U.S.C. 154(b) by 9 days.

(21) Appl. No.: 15/600,209

(22) Filed: May 19, 2017

(65) Prior Publication Data

US 2018/0337073 A1    Nov. 22, 2018

(51) Int. Cl.
*H01L 21/02* (2006.01)
*H01L 21/67* (2006.01)
(Continued)

(52) U.S. Cl.
CPC .... *H01L 21/02005* (2013.01); *F27B 17/0025* (2013.01); *H01L 21/6719* (2013.01);
(Continued)

(58) Field of Classification Search
CPC ......... H01L 21/67098; H01L 21/02005; H01L 21/68742; H01L 21/67748; H01L 21/6719;
(Continued)

(56) References Cited

U.S. PATENT DOCUMENTS 6,294,219 B1 * 9/2001 Tsai ................... C03C 17/22
257/E21.101
2002/0063084 A1 * 5/2002 Lin ..................... B01D 46/12
209/235
(Continued)

FOREIGN PATENT DOCUMENTS

JP         2001217170 A      8/2001
KR    10-2013-0027810   *  3/2013
(Continued)

OTHER PUBLICATIONS

International Search Report and Written Opinion for Application No. PCT/2018/032983.

*Primary Examiner* — Matthew L Reames
*Assistant Examiner* — Benjamin T Liu
(74) *Attorney, Agent, or Firm* — Patterson + Sheridan, LLP

(57) ABSTRACT

The present disclosure generally relates to methods and apparatus for heating a substrate as well as a slot management method for a thermal treatment chamber that in one embodiment includes providing a first substrate to a first slot of a carrier in the thermal treatment chamber via a transfer opening formed in the thermal treatment chamber, the first substrate having a specified anneal time, heating the substrate, moving the carrier to a lowermost position in the thermal treatment chamber using an elevator mechanism coupled to the carrier, and moving the carrier such that the first slot is in a position adjacent to the transfer opening using the elevator mechanism within a carrier transfer time period and transferring the first substrate out of the thermal treatment chamber at a determined time period for anneal.

20 Claims, 6 Drawing Sheets

(51) Int. Cl.
*F27B 17/00* (2006.01)
*H01L 21/677* (2006.01)
*H01L 21/687* (2006.01)

(52) U.S. Cl.
CPC .. *H01L 21/67109* (2013.01); *H01L 21/67248* (2013.01); *H01L 21/67748* (2013.01); *H01L 21/68742* (2013.01); *F27B 2017/0091* (2013.01)

(58) Field of Classification Search
CPC ......... H01L 21/67109; H01L 21/67248; F27B 17/0025; F27B 2017/0091
See application file for complete search history.

(56) References Cited

U.S. PATENT DOCUMENTS

2006/0223334 A1 10/2006 Saki
2014/0271054 A1 9/2014 Weaver et al.

FOREIGN PATENT DOCUMENTS

KR 20130027810 A 3/2013
KR 101275152 B1 6/2013

\* cited by examiner

METHOD AND APPARATUS FOR SUBSTRATE TRANSFER IN A THERMAL TREATMENT CHAMBER

BACKGROUND

Field

Embodiments of the present disclosure generally relate to methods and apparatus for heating substrates in a thermal treatment chamber, such as an annealing chamber that processes large area flat media, such as large area substrates. More specifically, embodiments disclosed herein relate to improved substrate transfer processes in a thermal treatment chamber.

Description of the Related Art

Flat media, such as rectangular, flexible sheets of glass, plastic, silicon, ceramic, or other material, is typically used in the manufacture of flat panel displays and solar devices, among other applications. Materials to form electronic devices, films and other structures on the flat media are deposited onto the flat media by numerous processes. Typically, thermal processes, such as an annealing process, are performed on the substrate prior to or after deposition in a thermal treatment chamber.

In the thermal treatment chamber, a plurality of substrates may be heated at the same time. However, each substrate must be heated at a specified temperature for a specified anneal time period to prevent over-annealing. Each substrate is typically supported on a respective substrate support within the thermal treatment chamber. Some of these substrate supports may include a heater to heat the substrate to temperatures of about 200 degrees Celsius to about 600 degrees Celsius, or greater, for the specified anneal time period. Each of the substrate supports may be coupled to a positioning mechanism that positions one of the substrate supports in proximity to a slit valve or port to facilitate substrate transfer. However, over-annealing of substrates is common due to mis-management of the thermal treatment chamber.

Therefore, there is a need in the art for an apparatus and methods for improved timing of substrate transfer in a thermal treatment chamber.

SUMMARY OF THE DISCLOSURE

The present disclosure generally relates to methods and apparatus for heating a substrate as well as a slot management method for a thermal treatment chamber that in one embodiment includes providing a first substrate to a first slot of a carrier in the thermal treatment chamber via a transfer opening formed in the thermal treatment chamber, the first substrate having a specified anneal time, heating the substrate, moving the carrier to a lowermost position in the thermal treatment chamber using an elevator mechanism coupled to the carrier, and moving the carrier such that the first slot is in a position adjacent to the transfer opening using the elevator mechanism within a carrier transfer time period and transferring the first substrate out of the thermal treatment chamber at a determined time period for anneal.

In another embodiment, a method for managing a substrate processing tool is disclosed and includes providing a first substrate to a first slot of a carrier in a thermal treatment chamber via a transfer opening formed in the thermal treatment chamber in selective communication with a transfer chamber, the first substrate having a first specified anneal time, heating the substrate, moving the carrier to a lowermost position in the thermal treatment chamber using an elevator mechanism coupled to the carrier, and moving the carrier such that the first slot is in a position adjacent to the transfer opening using the elevator mechanism within a carrier transfer time period and transferring the first substrate out of the thermal treatment chamber at a determined time period for anneal.

In another embodiment, a method for managing a substrate processing tool is provided and includes staggering transfer of a first substrate, a second substrate, and a third substrate to a respective first slot, a respective second slot, and a respective third slot of a carrier in a thermal treatment chamber via a transfer opening formed in the thermal treatment chamber in selective communication with a transfer chamber, the first substrate, the second substrate, and the third substrate each having a respective specified anneal time. The method also includes moving the carrier to a lowermost position in the thermal treatment chamber using an elevator mechanism coupled to the carrier after each of the first substrate, the second substrate, and the third substrate have been transferred, and timing movement of the carrier from the lowermost position to a position adjacent to the transfer opening using the elevator mechanism such that each of the first substrate, the second substrate, and the third substrate are transferred out of the thermal treatment chamber at a respective determined time period for anneal.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

Embodiments of the present disclosure generally relate to methods and apparatus for heating a substrate in a thermal treatment chamber. The thermal treatment chamber is exemplarily described herein as an annealing chamber. Suitable chambers that may be modified to practice the disclosure are available from AKT, a subsidiary of Applied Materials, Inc., Santa Clara, Calif. It is to be understood that the embodiments disclosed herein are suitable for use on chambers available from other manufacturers as well.

Figure 1:
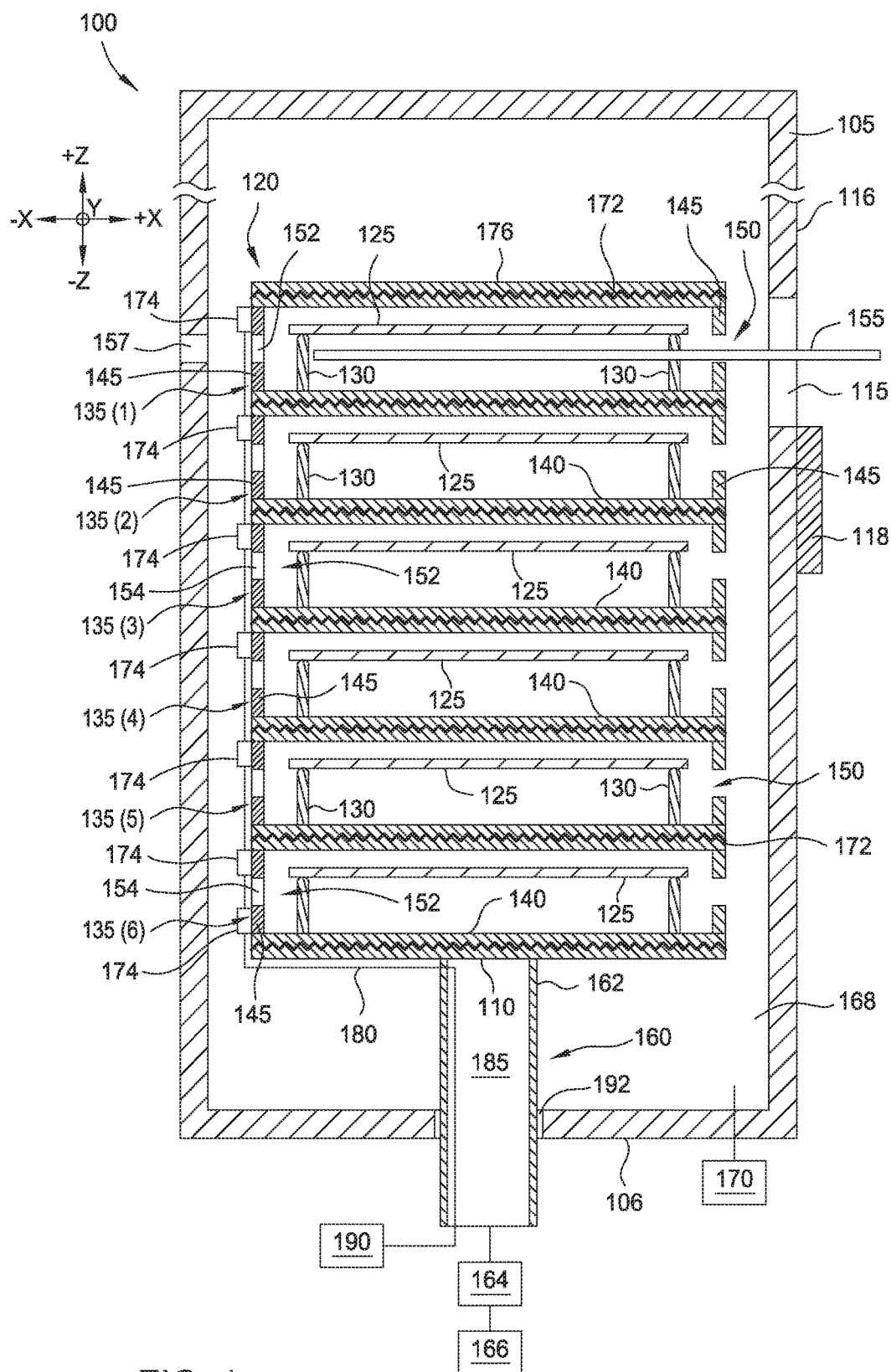
FIG. 1 is a cross-sectional view of a thermal treatment chamber.

FIG. 1 is a cross-sectional view of a thermal treatment chamber 100 utilized for heating multiple substrates, for example in an annealing process. The thermal treatment chamber 100 comprises a chamber body 105 having a bottom 106 and a slit valve opening 115 in a sidewall 116 (e.g., a transfer opening). The slit valve opening 115 is selectively sealed by a door 118. A carrier 120 for supporting one or more substrates 125 is disposed in an interior volume of the chamber body 105. The substrates 125 may be supported within the carrier 120 by pins 130.

The carrier 120 includes a plurality of heated substrate slots 135. Each of the heated substrate slots 135 includes a bottom 140 and sidewalls 145. Each of the heated substrate slots 135 is configured to support a substrate 125 in a spaced-apart relation from the bottom 140 of each of the heated substrate slots 135 utilizing the pins 130. Substrates 125 are transferred into and out of the heated substrate slots 135 though an opening 150 in the sidewall 145 and the slit valve opening 115. When open, the slit valve opening 115 permits an end effector 155 to enter and exit the thermal treatment chamber 100 and deliver or retrieve a substrate 125. The carrier 120 is coupled to an elevator mechanism 160 that moves the carrier 120 in the Z direction relative to the slit valve opening 115. The elevator mechanism 160 includes a shaft 162 disposed through the bottom 106 of the chamber body 105 that is coupled to an actuator 164. The actuator 164 is coupled to a controller 166. In the position shown in FIG. 1, the elevator mechanism 160 lowers the carrier 120 in the −Z direction so that the substrate 125 contacts the end effector 155. The elevator mechanism 160 lowers the carrier 120 slightly more in the −Z direction such that the substrate 125 is moved out of contact with the pins 130 while supported on the end effector 155. Once the substrate 125 is moved away from the pins 130, the end effector 155 can remove the substrate 125 in the +X direction.

Loading of a new substrate may be accomplished by moving the end effector 155 in the −X direction into the heated substrate slot 135 through the slit valve opening 115. The elevator mechanism 160 raises the carrier 120 in the +Z direction such that the new substrate contacts and is supported by the pins 130. Thereafter, the end effector 155 moved out of the chamber body 105. The door 118 can then be closed and an interior volume 168 of the chamber body 105 may be pumped down using a vacuum pump 170. Pressures within the interior volume 168 can cycle between ambient pressure to the milliTorr range. The substrates 125 disposed in the heated substrate slots 135 are in communication with the pressure or vacuum of the interior volume 168 through at least the openings 150. In some embodiments, each heated substrate slot 135 includes an opening 152 that aligns with an opening 154 in the sidewall 145 of the carrier 120. The openings 152 and 154 may be utilized as view windows when aligned with an opening 157 formed in the sidewall 116 of the chamber body 105.

Each of the heated substrate slots 135 include a heater 172. The heater 172 may be embedded or positioned on at least the bottoms 140 of the heated substrate slots 135. In some embodiments, a top 176 of the carrier 120 includes a heater 172. Each of the heaters 172 are coupled to a connector 174 disposed outside of the heated substrate slots 135 and within the interior volume 168 of the chamber body 105. Leads 180 for each of the heaters 172 are routed through a channel 185 formed in the shaft 162. The leads 180 are coupled to a power supply 190 outside of the chamber body 105.

The heated substrate slots 135 may be referred to as slots 1-6 from the +Z direction to the −Z direction. The substrates 125 can be transferred to each slot from a transfer chamber (shown as 221 and 223 in FIG. 2) having the end effector 155. For example, an un-annealed substrate may be transferred into the slot 6 in FIG. 1. Once an individual substrate 125 is loaded, and the door 118 is closed, an anneal time period begins for that substrate. As an example, an anneal time period may be about 540 seconds with a tolerance of about +20 seconds (e.g., a maximum anneal time of about 600 seconds). Other substrates 125 may be transferred to empty slots or removed from slots during the anneal time period for the substrate 125 in slot 6.

However, during the anneal time period, the elevator mechanism 160 lowers the carrier 120 to a position adjacent the bottom 106 (e.g., the lowermost position). The lowering of the carrier 120 positions portions of the shaft 162 outside the environment of the interior volume 168. Temperatures in the interior volume 168 may cause the shaft 162 to expand when the shaft 162 is exposed to elevated temperatures in the interior volume 168 for extended periods. Undesirable thermal expansion of the shaft 162 may cause damage to a vacuum seal 192 disposed about the shaft 162. Thus, lowering of the carrier 120 to the lowermost position minimizes exposure of the shaft 162 to the interior volume 168, which protects the shaft 162 and the vacuum seal 192.

However, lowering of the carrier 120 extends travel time of the carrier 120 when substrates are transferred. For example, moving the carrier 120 from the lowermost position to a position where the slot 6 is adjacent to the slit valve opening 115 (e.g., a carrier transfer time period) may take about 30 seconds when the elevator mechanism 160 is operated at a suitable speed (e.g., velocity and acceleration). A suitable transfer speed of the elevator mechanism 160 is a velocity and acceleration where vibration of the substrates 125 does not occur (excessive vibration may cause breakage of the substrates 125).

Figure 2:
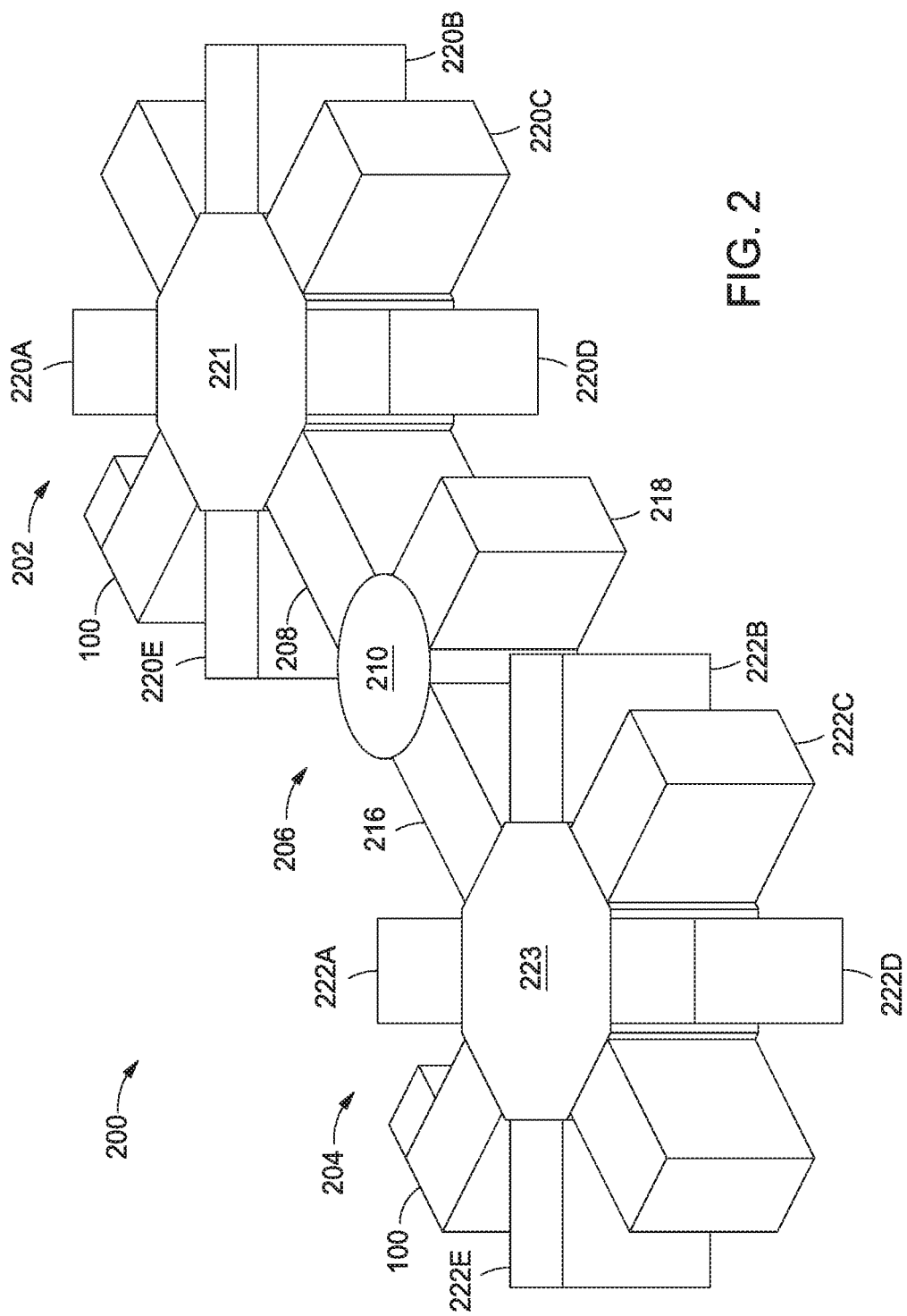
FIG. 2 illustrates a schematic, perspective view of a processing system having a thermal treatment chamber thereon.

FIG. 2 illustrates a schematic, perspective view of a processing system 200. In one embodiment, the thermal treatment chamber 100 may be beneficially incorporated into the processing system 200. The processing system 200 includes a first cluster tool 202 and a second cluster tool 204 joined by intermediate chambers 206. The intermediate chambers 206 include a first pass through chamber 208, a turn chamber 210, a second pass through chamber 216, and an optional buffer chamber 218. In some embodiments, the buffer chamber 218 may be replaced by the thermal treatment chamber 100 on one or both of the first cluster tool 202 and the second cluster tool 204 as one or more substrates may be stored therein.

The first cluster tool 202 may include one or more processing chambers 220A-220E, a first transfer chamber 221, and the thermal treatment chamber 100. The processing chambers 220A-220E and the thermal treatment chamber 100 may be coupled to the first transfer chamber 221 and disposed radially thereabout. The second cluster tool 204 may include one or more processing chambers 222A-222E, a second transfer chamber 223, and the thermal treatment chamber 100. Similar to the first cluster tool 202, the processing chambers 222A-222E and the thermal treatment chamber 100 may be coupled to the second transfer chamber 223 and disposed radially thereabout.

In operation, one or more substrates are transferred to the thermal treatment chamber 100 by a robot disposed in the first transfer chamber 221 and undergo an annealing process therein. Each of the one or more substrates are transferred (inserted) into the thermal treatment chamber 100 at different times in order to reduce heat loss from the thermal treatment chamber 100 though the slit valve opening 115. Thereafter, substrates are retrieved from the thermal treatment chamber 100 by the robot disposed in the first transfer chamber 221 and positioned in the processing chambers 220A-220E. Each of the one or more substrates are transferred out of the thermal treatment chamber 100 at different times in order to reduce heat loss from the thermal treatment chamber 100 though the slit valve opening 115. Substrates are processed in the processing chambers 220A-220E to deposit one or more layers on the substrates. After deposition of the one or more layers, the substrates are transferred to the second cluster tool 204 through the first pass through chamber 208, the turn chamber 210, and the second pass through chamber 216. Prior to processing the substrates in the second cluster tool 204, a robot disposed in the second transfer chamber 223 can optionally retrieve substrates from the thermal treatment chamber 100 coupled to the transfer chamber 220 and position the substrates in the processing chambers 222A-222E. The robot disposed in the second transfer chamber 223 can receive the substrates from the second pass through chamber 216 and position the substrates in the processing chambers 222A-222E to deposit one or more layers on the substrates. It is to be understood that while the transfer chambers 221, 223 have been shown as eight sided transfer chambers able to accommodate up to eight chambers coupled thereto, other sized transfer chambers are contemplated such as six sided transfer chambers. Additionally, it is to be understood that the processing chambers 220A-220E, 222A-222E may comprise suitable chambers for processing substrates such as PECVD, CVD, ALD, PVD, etching, and other chambers.

As discussed above, movement and/or sequencing of the carrier 120 of FIG. 1 may be improved as described herein. For example, the carrier 120 may be moved by the elevator mechanism to sequence substrates for loading and unloading at a velocity where minimal to no vibration occurs during movement thereof to prevent breakage of substrates and anneal times are achieved. The improved sequencing may prevent over-annealing of substrates 125, reduce the waiting time of the end effector 155, prevent or minimize heat loss from the interior volume 168 during transfer, as well as improve overall throughput of a processing system, such as the processing system 200. Additionally, embodiments disclosed herein may be more environmentally friendly because of reduced usage of the actuator 164 to move the carrier 120, which may also result in longer lifetime of the actuator 164.

To improve movement of the carrier 120 as well as manage the loading and unloading of substrates 125 to and from the slots 1-6 shown in FIG. 1, the inventors have devised and tested a slot assignment method as will be described below.

Figure 3:
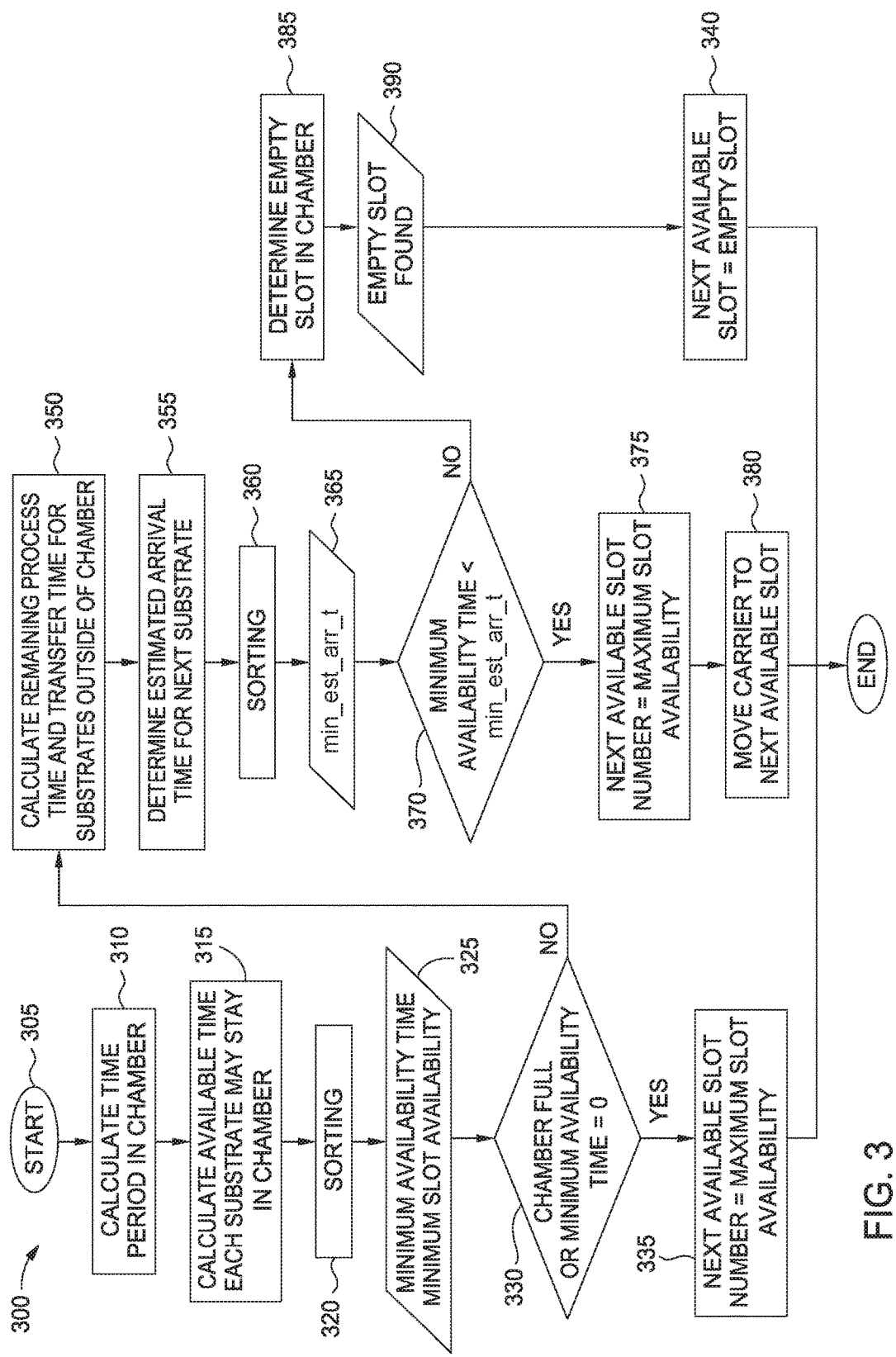
FIG. 3 is a flow chart showing one embodiment of a slot assignment method.

FIG. 3 is a flow chart showing one embodiment of a slot assignment method 300. The slot assignment method 300 may be performed by a controller with associated hardware and software configured to perform the actions as described herein. The slot assignment method starts at 305 and, as an example, the thermal treatment chamber 100 may have three substrates housed therein in a respective slot. In the example, one substrate may occupy slot 1, another substrate may occupy slot 2, and another substrate may occupy slot 3 of the carrier 120 at 305. In the example, slots 4-6 are empty. The time of insertion into the thermal treatment chamber 100 of each substrate may be referred to as "entrance time". Further, each of the three substrates in the respective slots 1-3 have a specified annealing time period, such as about 100 seconds. If the specified annealing time period is exceeded, over-annealing may occur.

The slot assignment method 300 continues at 310 where a time period for each substrate 125 in the thermal treatment chamber 100 is calculated (e.g., a "duration time"). The duration time may be defined as the time a particular substrate may remain in its current location in the thermal treatment chamber 100. The duration time may be determined by subtracting the entrance time from the current time (i.e., duration time=current time−entrance time). For example, if the substrate in slot 1 entered the thermal treatment chamber 100 at 17:20:15 and the current time is 17:20:45, the duration time is 30 seconds.

The slot assignment method 300 continues at 315 where an "available" time is calculated for each substrate in the thermal treatment chamber 100. Available time may be defined as the time period a substrate may remain in its current location in the thermal treatment chamber 100. Available time may be determined by subtracting duration time from the annealing time period for each substrate (i.e., available time=specified annealing time period−duration time).

In the example above wherein a substrate occupies each of slots 1-3 (i.e., 3 substrates) and slots 4-6 are empty, if the duration time of the substrate in slot 1 is 30 seconds, the duration time of the substrate in slot 2 is 25 seconds, and the duration time of the substrate in slot 3 is 50 seconds, then the available time of the substrate in slot 1 is 70 seconds, the available remaining time of the substrate in slot 2 is 75 seconds, and the available remaining time of the substrate in slot 3 is 50 seconds. The slot assignment method 300 then continues at 320 where a sort process is provided.

At 320, a sorting occurs of occupied slots in the thermal treatment chamber 100 (i.e., slots 1-3 in the example) based on available time. In one implementation of the sorting, the time to complete the heating process for each substrate is calculated and the substrates are sorted from minimum to maximum, and the substrate with the smaller minimum available time gets higher priority. In the example above, a list is developed after 320 which may include slot 3:50 seconds; slot 1:70 seconds; and slot 2:75 seconds.

At 325, the slot having a minimum availability time out of the occupied slots (i.e., slots 1-3 in the example) is determined. For example, minimum availability time is the minimal of all available time in occupied slots (i.e., slots 1-3 in the example), and a minimum slot availability, which indicates the slot number having the substrate with a minimum available time, is determined. In the example above, slot 3 has the minimum slot availability based on the minimum availability time (i.e., 50 seconds).

At 330 a decision is determined based on whether the thermal treatment chamber 100 is full (i.e., no unoccupied slots) or whether the minimum availability time=0.

If YES, then the slot assignment method 300 moves to 335 where a next available slot number is determined based on minimum slot availability (block 325) and the result is used to move the carrier 120 (via the elevator mechanism 160) to a position for the next transfer. In the example above, if the thermal treatment chamber 100 is full or the minimum availability time is equal to 0, the next available slot number is slot 3. Accordingly, the carrier 120 is moved to a position for transfer of the substrate from slot 3. Alternatively, if minimum availability time is less than a minimal estimated arrival time of a substrate from its current location in the first cluster tool 202 or the second cluster tool 204 to the thermal treatment chamber 100 (i.e. "min_est_arr_t") to the next empty slot in the thermal treatment chamber 100, then the carrier 120 would be moved to a position for transfer of a substrate to slot 4 (i.e., the next available slot or empty slot (block 340)).

If NO, the slot assignment method 300 continues at 350 where remaining processing time of a substrate (e.g., "substrate A") in the first cluster tool 202 or the second cluster tool 204 is calculated along with a transfer time for the substrate from the first cluster tool 202 or the second cluster tool 204 to the thermal treatment chamber 100. For example, if substrate A is being processed in one of the processing chambers 220A-220E or the processing chambers 222A-222E of FIG. 2, the remaining processing time of substrate A as well as the transfer time of substrate A from the processing chambers 220A-220E or the processing chambers 222A-222E to the thermal treatment chamber 100 is determined.

As an example, substrate A is transferred into one of the processing chambers 220A-220E or the processing chambers 222A-222E at 17:20:00, and the process recipe time for substrate A is 100 seconds. If the current time is 17:20:15, then the remaining processing time for substrate A is 85 seconds. The transfer time to transport substrate A from one of the processing chambers 220A-220E or the processing chambers 222A-222E is for example, 10 seconds. In this specific example, the result of block 350 would be 95 seconds (i.e., 85 seconds+10 seconds).

Next, the slot assignment method 300 continues at 355 where estimated arrival time for the next substrate to be transferred to the thermal treatment chamber 100 is determined. The estimated arrival time is the remaining processing time+the transfer time for each of the substrates B-D. As an example, if the processing chambers 220A-220C are processing three substrates (e.g., substrates B-D), the estimated arrival time for each of the substrates B-D to the thermal treatment chamber 100 can be calculated. Specifically, in one example, the estimated arrival time for substrate B may be 95 seconds, the estimated arrival time for substrate C may be 60 seconds, and the estimated arrival time for substrate D may be 105 seconds.

The substrates B-D are then sorted according to estimated arrival time at 360. For example, the time when substrates will arrive at the thermal treatment chamber 100 is calculated and the substrates are sorted from minimum to maximum, and the substrate with the least minimum arrival time gets higher priority.

At 370, the next substrate to be transferred into the thermal treatment chamber 100 based on the min_est_arr_t is determined. In the specific example using the estimated arrival time for substrates B-D, substrate C, having the shortest estimated arrival time, would be queued for transfer into the thermal treatment chamber 100.

At 375, the minimum availability time is compared with the min_est_arr_t. If the minimum availability time is less than the min_est_arr_t (YES), the slot assignment method 300 continues at 380 wherein a next available slot number is determined based on minimum slot availability and the result is used to move the carrier 120 (via the elevator mechanism 160) to a position for the next transfer. In the example above, the substrate in slot 3 having a minimum availability time of 50 seconds meets this condition (i.e., minimum availability time (50 seconds) is less than min_est_arr_t (60 seconds (substrate C))). Thus, in the example, the carrier 120 is moved to a position for transferring the substrate from slot 3 out of the thermal treatment chamber 100 and transferring substrate C into the thermal treatment chamber 100. This transfer may be accomplished within the specified anneal time period for the substrate in slot 3 and thus prevents over-annealing.

If the condition of 375 is not met (i.e., the minimum availability time is not less than the min_est_arr_t (NO)), the slot assignment method 300 continues at 385 where an empty slot in the thermal treatment chamber 100 is determined. Then, when an empty slot is found at 390, the slot assignment method 300 continues at 340 where the next available slot or empty slot is determined and the carrier 120 is moved to the next available slot. In the example above, slots 4-6 are determined to be empty and available for substrates B-D.

Figure 4A:
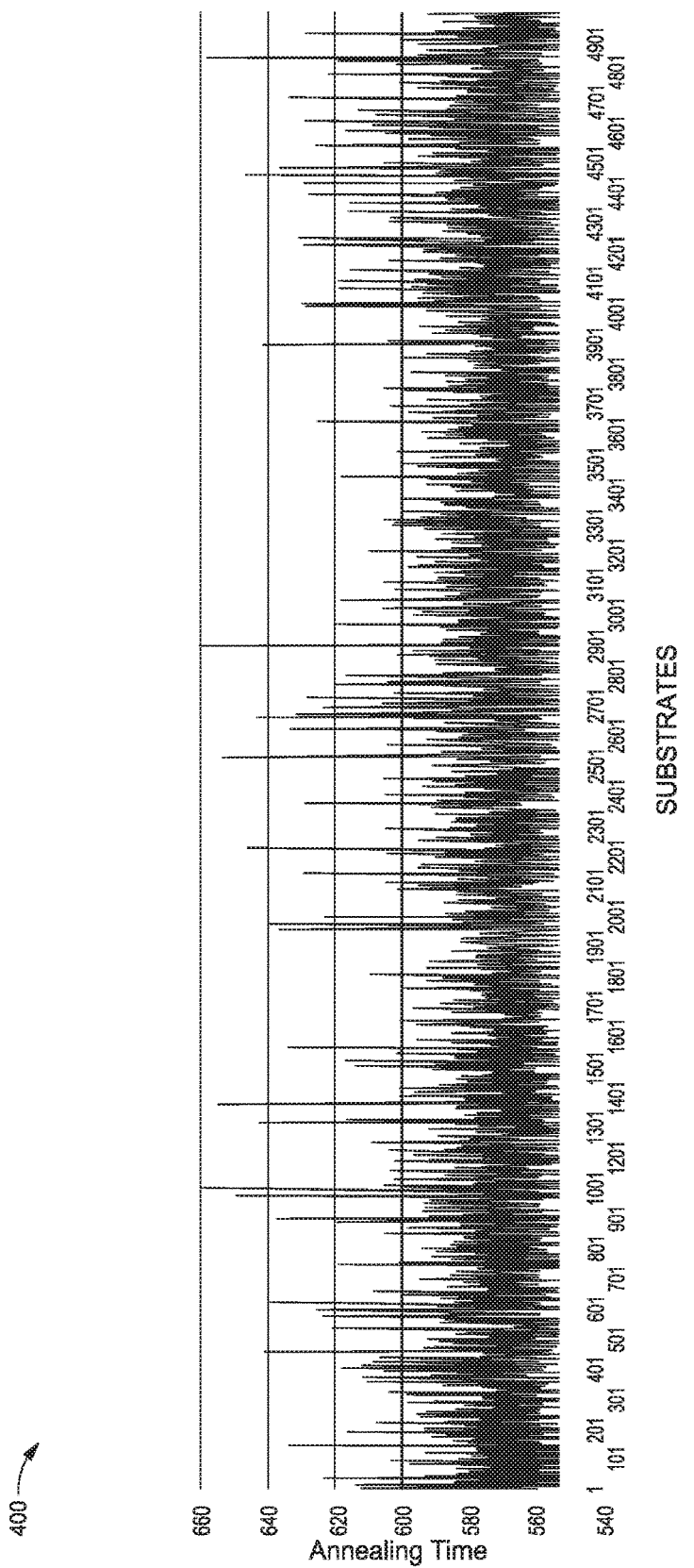
FIG. 4A is a graph showing anneal processes on multiple substrates versus time using typical slot management techniques.
Figure 4B:
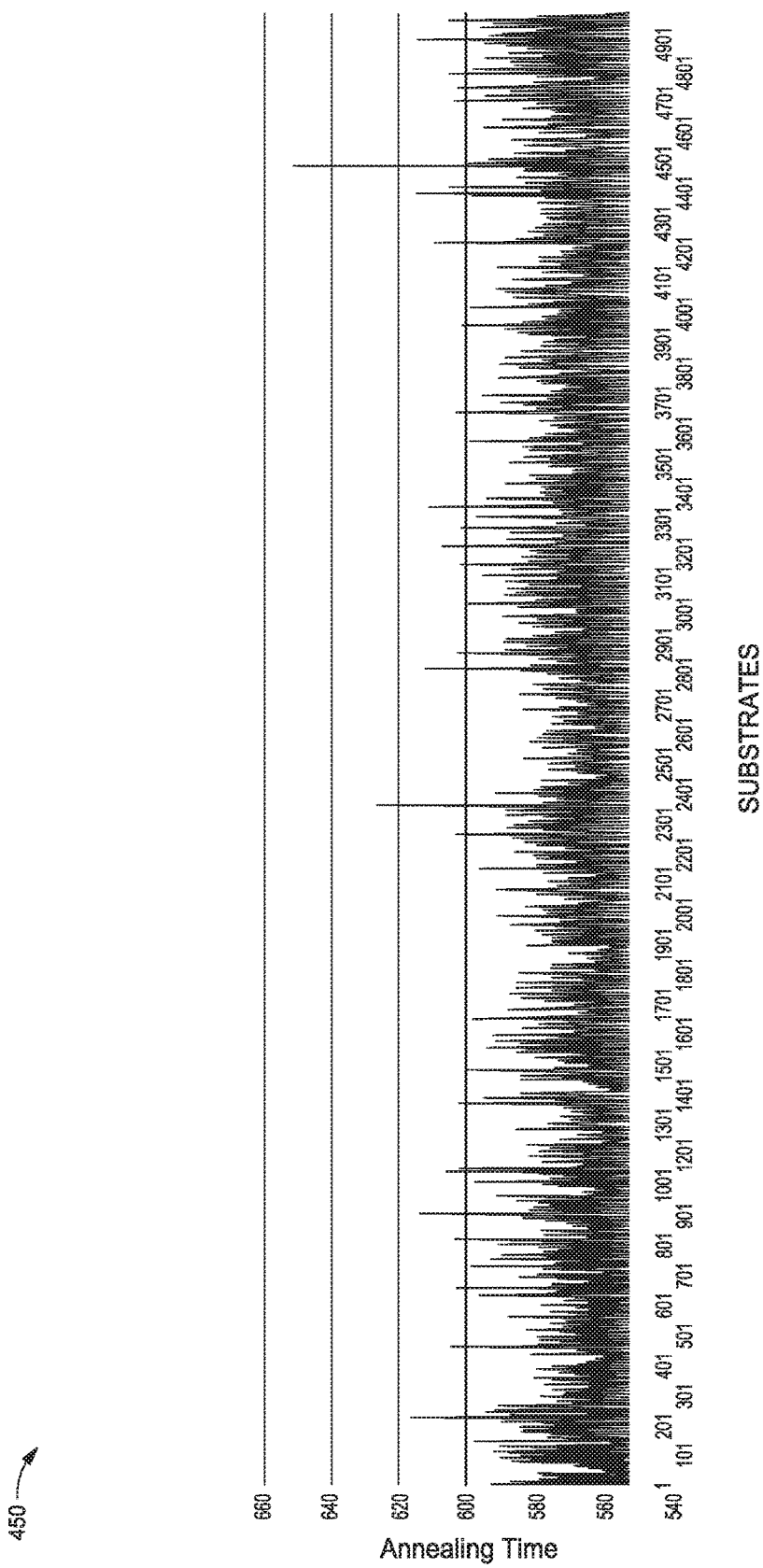
FIG. 4B is a graph showing anneal processes on multiple substrates versus time using the slot assignment method as described herein.
Figure 5:
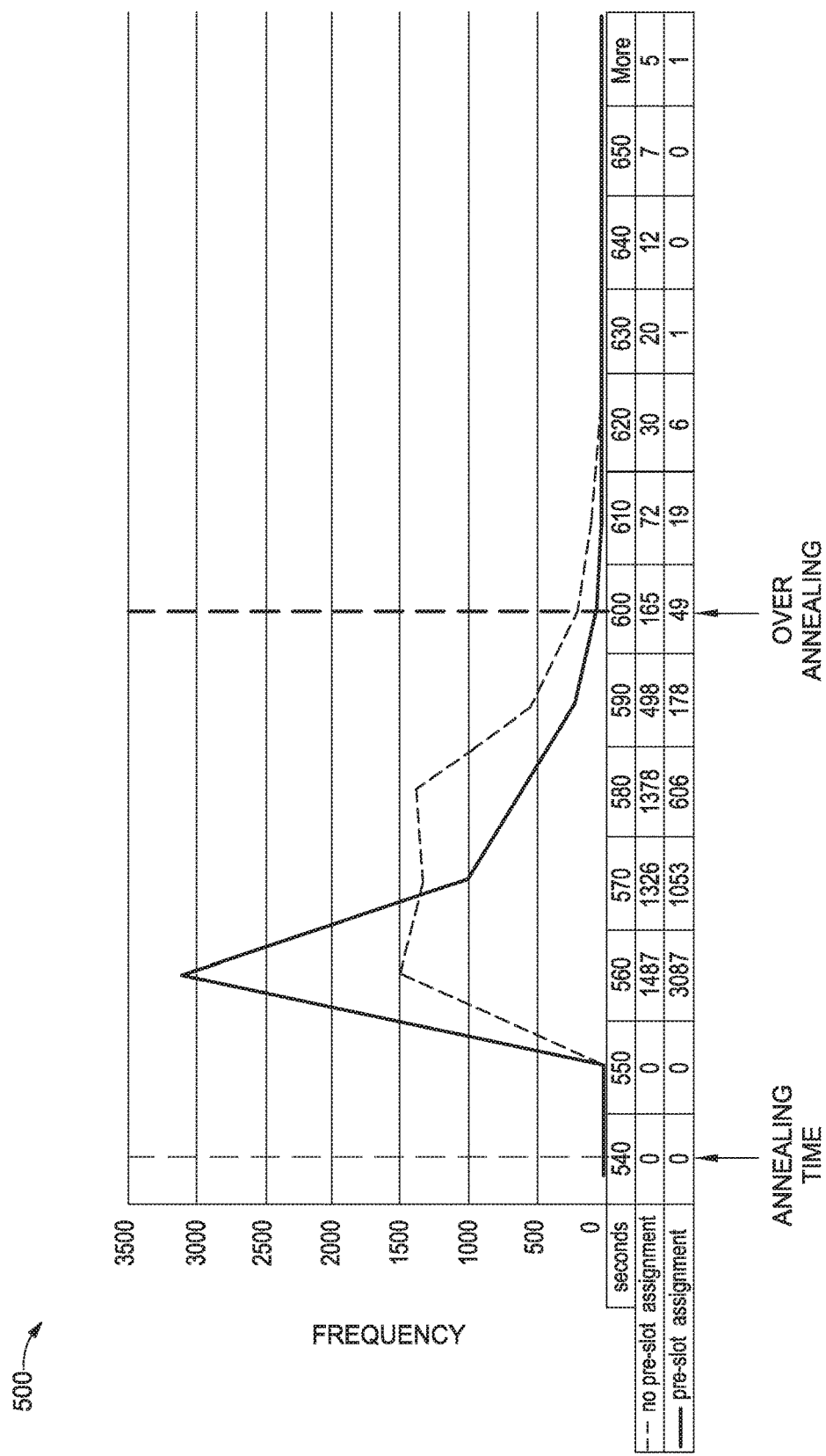
FIG. 5 is a histogram of annealing processes on multiple substrates comparing time versus frequency.

Simulations of the slot assignment method 300 were performed and the results are shown in FIGS. 4A, 4B and 5.

FIG. 4A is a graph showing anneal processes on multiple substrates (abscissa) versus time (ordinate) using conventional slot management techniques. FIG. 4B is a graph showing anneal processes on multiple substrates (abscissa) versus time (ordinate) using the slot assignment method 300 as described herein. Both of the anneal processes in FIGS. 4A and 4B have an anneal time period of 600 seconds. As seen in FIG. 4B, over-annealing was significantly reduced, indicated by fewer substrates exceeding the 600 second mark using the slot assignment method 300.

FIG. 5 is a histogram illustrating annealing processes on multiple substrates comparing time versus frequency. As shown, over-annealing was significantly reduced using the slot assignment method 300 as described herein. Thus, throughput may be optimized according to embodiments disclosed herein as the substrate(s) will be removed out of the thermal treatment chamber 100 on-time, which opens slots for new substrates.

Embodiments of the disclosure have resulted in reducing over-annealing by about 82%, improved throughput by about 4%, and improved standard deviation by about 21%.

While the foregoing is directed to embodiments of the present disclosure, other and further embodiments of the disclosure may be devised without departing from the basic scope thereof, and the scope thereof is determined by the claims that follow.

The invention claimed is:

1. A method for managing a thermal treatment chamber, comprising:
   staggering transfer of a first substrate, and a second substrate to a respective first slot, and a respective second slot of a carrier in the thermal treatment chamber via a transfer opening formed in the thermal treatment chamber, the first substrate and the second substrate each having a respective specified anneal time;
   moving the carrier to a lowermost position in the thermal treatment chamber using an elevator mechanism coupled to the carrier after each of the first substrate and the second substrate have been transferred; and
   timing movement of the carrier from the lowermost position to a position adjacent to the transfer opening using the elevator mechanism such that each of the first substrate and the second substrate are transferred out of the thermal treatment chamber at a respective determined time period for anneal.

2. The method of claim 1, wherein the first substrate and the second substrate are heated during a carrier transfer time period.

3. The method of claim 2, wherein the carrier is at the lowermost position prior to the second substrate being transferred.

4. The method of claim 3, wherein the carrier is moved from the lowermost position to position the second slot adjacent to the transfer opening prior to the second substrate being transferred.

5. The method of claim 2, further comprising:
moving the carrier to the lowermost position after transferring the second substrate into the thermal treatment chamber.

6. The method of claim 1, further comprising:
transferring a third substrate to a third slot of the carrier.

7. The method of claim 1, wherein the first substrate and the second substrate are heated during a respective carrier transfer time period, each of the carrier transfer time periods being based on a transfer speed of the elevator mechanism such that minimal to no vibration of the first substrate and the second substrate occurs during movement of the carrier.

8. The method of claim 1, further comprising:
depositing films onto one or more third substrates in a cluster tool; and
determining an arrival time of the one or more third substrates to the thermal treatment chamber.

9. The method of claim 8, wherein determining the arrival time further comprises:
calculating remaining processing time and a transfer time for the one or more third substrates in the cluster tool to the thermal treatment chamber.

10. A method for managing a substrate processing tool, comprising:
staggering transfer of a first substrate, and a second substrate to a respective first slot, and a respective second slot of a carrier in a thermal treatment chamber via a transfer opening formed in the thermal treatment chamber in selective communication with a transfer chamber, the first substrate and the second substrate each having a first specified anneal time and a second specified anneal time, respectively;
heating the substrates;
moving the carrier to a lowermost position in the thermal treatment chamber using an elevator mechanism coupled to the carrier after each of the first substrate and the second substrate have been transferred; and
timing movement of the carrier from the lowermost position to a position adjacent to the transfer opening using the elevator mechanism such that each of the first substrate and the second substrate are transferred out of the thermal treatment chamber at a respective determined time period for anneal.

11. The method of claim 10, further comprising:
depositing films onto one or more third substrates in the substrate processing tool; and
determining an arrival time of the one or more third substrates to the thermal treatment chamber.

12. The method of claim 11, wherein determining the arrival time further comprises:
calculating remaining processing time and a transfer time for the one or more third substrates in the substrate processing tool to the thermal treatment chamber.

13. The method of claim 10, further comprising:
transferring a third substrate into a third slot of the thermal treatment chamber during the second specified anneal time, the third substrate having a third specified anneal time.

14. The method of claim 13, wherein the first, the second, and the third specified anneal times are the same.

15. The method of claim 13, further comprising:
transferring a fourth substrate into a fourth slot of the thermal treatment chamber during the first, the second, and the third specified anneal times, the fourth substrate having a fourth specified anneal time.

16. The method of claim 15, further comprising:
moving the carrier such that the fourth slot is in a position adjacent to the transfer opening using the elevator mechanism and transferring the fourth substrate out of the thermal treatment chamber at or prior to conclusion of the fourth specified anneal time.

17. A method for managing a substrate processing tool, comprising:
staggering transfer of a first substrate, a second substrate, and a third substrate to a respective first slot, a respective second slot, and a respective third slot of a carrier in a thermal treatment chamber via a transfer opening formed in the thermal treatment chamber in selective communication with a transfer chamber, the first substrate, the second substrate, and the third substrate each having a respective specified anneal time;
moving the carrier to a lowermost position in the thermal treatment chamber using an elevator mechanism coupled to the carrier after each of the first substrate, the second substrate, and the third substrate have been transferred; and
timing movement of the carrier from the lowermost position to a position adjacent to the transfer opening using the elevator mechanism such that each of the first substrate, the second substrate, and the third substrate are transferred out of the thermal treatment chamber at a respective determined time period for anneal.

18. The method of claim 17, further comprising:
depositing films onto a fourth substrate in the substrate processing tool; and
determining an arrival time of the fourth substrate to the thermal treatment chamber.

19. The method of claim 18, wherein determining the arrival time further comprises:
calculating remaining processing time and a transfer time for the fourth substrate in the substrate processing tool to the thermal treatment chamber.

20. The method of claim 19, further comprising:
transferring the fourth substrate into a fourth slot of the thermal treatment chamber during the respective specified anneal time for each of the first substrate, the second substrate, and the third substrate.

* * * * *